United States Patent [19]

Hori

[11] Patent Number: 5,023,939

[45] Date of Patent: Jun. 11, 1991

[54] FM TUNER WITH BAND EXTRACTION AND OPTIMIZATION OF A PLL FM DEMODULATOR

[75] Inventor: Makoto Hori, Osaka, Japan

[73] Assignee: Sharp Kabushiki Kaisha, Osaka, Japan

[21] Appl. No.: 415,657

[22] Filed: Oct. 2, 1989

[30] Foreign Application Priority Data

Oct. 5, 1988 [JP] Japan .................. 63-251372

[51] Int. Cl.[5] .............................. H04B 1/16
[52] U.S. Cl. .................. 455/188; 455/266; 455/340
[58] Field of Search ............. 455/183, 200, 249, 260, 455/307, 254, 266, 208, 205, 340, 188–192

[56] References Cited

U.S. PATENT DOCUMENTS

| | | | |
|---|---|---|---|
| 3,909,735 | 9/1975 | Anderson et al. | 455/266 |
| 4,479,091 | 10/1984 | Yoshisato | 455/266 |
| 4,792,993 | 12/1988 | Ma | 455/266 |
| 4,816,770 | 3/1989 | Naumann | 455/266 |

Primary Examiner—Reinhard J. Eisenzopf
Assistant Examiner—Lisa Charouel

[57] ABSTRACT

An FM tuner including a PLLFM demodulation circuit is provided, which selectively employs one of two BPFs having different extraction bandwidths as an IFBPF. This FM tuner is configured such that by employing a relationship between a lock range and an input signal level of the PLLFM demodulation circuit, an optimum value of the lock range of the demodulation circuit is set for a bandwidth of an input signal, even if any of the BPFs is selected. When the BPF having a narrower bandwidth is selected as the IFBPF, a signal to be inputted to the PLLFM demodulation circuit is attenuated to decrease the level of the input signal of the demodulation circuit to be lower that the level when the other BPF with a larger bandwidth is selected as the IFBPF. As a result, a lock range width of the PLLFM demodulation circuit is reduced.

15 Claims, 6 Drawing Sheets

FM TUNER WITH BAND EXTRACTION AND OPTIMIZATION OF A PLL FM DEMODULATOR

BACKGROUND OF THE INVENTION

1. Field of the Invention The present invention relates generally to FM tuners including PLLFM demodulation circuits employing a PLL (Phase Locked Loop), and more particularly, to a FM tuner having bandpass filters of an intermediate frequency stage with variable extraction bandwidths.

2. Description of the Background Art A receiver for television and radio broadcasting includes a tuner for selecting a desired transmission to demodulate a signal transmitted with being tuned in to a carrier frequency thereof.

Particularly, a FM tuner included in a receiver for receiving FM broadcasting generally includes a high frequency amplifying circuit portion including a high frequency amplifier for amplifying a received FM signal of a high frequency, and a mixer for converting a frequency band of the FM signal amplified by the high frequency amplifier into an IF (an intermediate frequency band) based on an oscillation frequency of a local oscillator. The FM tuner further includes BPFs (Band-pass Filters) for extracting a predetermined band component from the FM signal frequency-converted in the mixer, an IF amplifying portion for amplifying the FM signal of the band extracted by the BPF to a fixed level, and a FM demodulation circuit for demodulating the FM signal amplified by the IF amplifying portion.

A so-called PLLFM demodulation circuit employing the PLL is widely used as the FM demodulation circuit.

The PLL is employed for a precise frequency follow. FIG. 1 is a schematic block diagram of the PLL. Referring to FIG. 1, the PLL is a closed loop including a phase comparator 100, a LPF (Low Pass Filter) 101 and a VCO (Voltage Controlled Oscillator) 102. The VCO is an oscillator having an oscillation frequency varied in accordance with an input voltage. An operation of the PLL will be described as follows.

In the case when a frequency output $f_0$ of the VCO 102 coincides with a frequency of an input wave $f_1$, and a predetermined relationship is established between a phase of the output $f_0$ of the VCO 102 and a phase of the input wave $f_1$, the frequency of the output $f_0$ is stable because change in an output of the LPF 101. However, an output of the phase comparator 100 changes with a change in the input wave $f_1$ and is filtered by the LPF 101 to be outputted as a control voltage of the VCO 102. Accordingly, the frequency of the output $f_0$ of the VCO 102 changes and coincides again with the frequency of the input wave $f_1$ to be stable. That is, an input frequency is locked in the PLL. Therefore, the output of the LPF 101, i.e., the control voltage of the VCO 102 changes in accordance with the change in the frequency of the input $f_1$ of the PLL. Thus, a FM signal, which is to be demodulated is inputted to the PLL as the input wave $f_1$, so that the control voltage of the VCO is derived as a FM detected output in the PLLFM demodulator.

The PLL cannot perform such a lock operation as described above for input waves of all the frequencies. That is, the PLL has a so-called lock range, namely, a specific input frequency range, so that when the PLL is stable, namely, at a phase locked state that the frequency of the input wave is equivalent to that of an output wave, the phase locked state can be maintained even with a moderate change in the frequency of the input wave. The lock range of the PLL is determined by characteristics of the phase comparator, the LPF, the VCO or the like included in the PLL. Therefore, the PLLFM demodulation circuit employing the PLL has the lock range determined by characteristics of the phase comparator, the LPF, the VCO or the like included therein. Thereby if the frequency of an input signal is within this lock range, the VCO in the PLL operates in accordance with an instantaneous frequency of the input signal, so that FM demodulation is carried out. However, if the frequency of the input signal is out of the lock range, the VCO in the PLL does not follow the instantaneous frequency of the input signal, so that the FM demodulation is not carried out. That is, the PLLFM demodulation circuit serves, as a filter for selectively demodulating only the input signals having frequencies are within the lock range. Thus, the lock range of the PLLFM demodulation circuit in the FM tuner is set to an optimum value for a bandwidth of the BPF at the IF stage so that unnecessary frequency components and noise are removed from the input signals to the PLLFM demodulation circuit by this filter function.

In the FM tuner having the PLLFM demodulation circuit as described above, the bandwidth BW of the BPF provided at a preceding stage of the IF amplifying portion (hereinafter referred to as IFBPF) is set to a Carson band $W (=2 \cdot f_m + \Delta f + f')$ determined by a maximum modulation frequency $f_m$, a frequency deviation $\Delta f$ and an energy diffusion signal frequency $f'$ of a FM signal to be inputted, in order to extract a band in which the electric power of the FM signal is substantially concentrated. Therefore, the bandwidth of the IFBPFs varies depending on a FM signal to be transmitted to the FM tuner including the IFBPFs. Accordingly, one of the FM tuners which receive various kinds of FM signals having different maximum modulation frequencies, frequency deviations $\Delta f$ and energy diffusion frequencies $f'$, is configured such that the bandwidth of the IFBPFs can be switched in accordance with the frequency of a received signal.

Since, a broadcast frequency of a satellite broadcast has been in greater use, for example, a signal is transmitted as a FM signal with a maximum modulation frequency $f_m$, a frequency deviation $\Delta f$, an energy diffusion frequency $f'$ and the like varying depending on the type of a transponder installed in a communication satellite, a DBS (Direct Broadcast Satellite) tuner for receiving the satellite broadcast includes a plurality of BPFs having different bandwidths as the IFBPFs. The BPF to be employed is switched to another BPF in accordance with the received signal. However, due to problems concerning cost, in a conventional FM tuner with the IFBPFs having variable bandwidths, the lock range of the PLL demodulation circuit is set to an optimum value for the bandwidth of one of the BPFs, which is especially associated with performance of the FM tuner.

In the case of such a FM tuner where the bandwidth of the IFBPFs can be switched to 30 MHz and to 15 MHz, for example, the lock range of the PLL demodulation circuit can only be set to an optimum value corresponding to one of the bandwidths of the BPFs, i.e., 15 MHZ or 30 MHz. As a result, the following problems are caused.

FIG. 2 is a schematic diagram for illustrating disadvantages of the conventional FM tuner including the PLLFM demodulation circuit as described above.

Referring to FIG. 2, in case when the lock range of the PLLFM demodulation circuit is optimized for the bandwidth 30 MHz of the IFBPFs to be set to the frequency $f_2$ to $f_3$, for example, the lock range of the PLLFM demodulation circuit does not attain an optimum value because the lock range is too large for the bandwidth of the IFBPFs when the bandwidth of the IFBPFs is switched to 15 MHz. In more, the optimum value of the lock range of the PLL demodulation circuit should be $f_2$ to $f_3$ in the bandwidth of 30 MHz and $f_4$ and $f_5$ in the bandwidth of 15 MHz. In the case when the lock range of the circuit is optimized for the larger bandwidth (30 MHz), and the bandwidth of the IFBPFs is switched to the smaller value at this time, unnecessary signals of $f_2$ to $f_4$ and $f_5$ to $f_3$ are demodulated by the PLL demodulator. Therefore, if the lock range of the PLLFM demodulation circuit is optimized for the larger bandwidth of the IFBPFs, the lock range is too large for the bandwidth of the input signal (the bandwidth of the IFBPF) when the bandwidth of the IFBPFs is switched to the smaller bandwidth. Accordingly, the PLLFM demodulation circuit no longer serves as a filter, and thus becomes susceptible to noise and interference due to a signal of an adjacent channel.

In order to eliminate these problems, it is necessary to eliminate signals and noises of unrequired frequency components as much as possible in the FM signal to be outputted from the IFBPFs. In order to meet requirement, a filter must be employed as the IFBPF, which has such a characteristic that a gain for an input signal shows an extremely sharp decrease when the frequency of the input signal drops out of the bandwidth to be extracted. However, the use of such filter with a superior characteristics causes an increase in cost.

Again referring to FIG. 2, in the case when the lock range of the PLLFM demodulation circuit is optimized for the bandwidth 15 MHz of the IFBPFs to be set to the frequency $f_4$ to $f_5$, for example, on the contrary to the above case, there is no problem as in the above case when the bandwidth of the IFBPFs is selected to 15 MHz. However, when the bandwidth is selected to 30 MHz, the lock range of the PLLFM demodulation circuit does not attain an optimum value because the lock range is too narrow for the bandwidth of the input signal. If the lock range is extremely too for this bandwidth, it sometimes more narrow than the bandwidth of the IFBPFs. In more detail, if the lock range of the PLLFM demodulation circuit is too narrow for the bandwidth 30 MHz of the IFBPFs, a portion of the signal components extracted by the IFBPFs is not demodulated because the portion is out of the lock range of the PLLFM demodulation circuit. Accordingly, in this case, the same phenomenon occurs as in the case when the bandwidth of the IFBPFs more narrow than an optimum value corresponding to a received signal, namely, the above described Carson band, and thus even necessary signal components are removed in the IFBPFs. That is, due to an inadequate bandwidth of the IFBPFs, so-called truncation noise occurs in a demodulated signal. This noise is caused by distortion occurring in the modulated signal because a portion of the signal components required for demodulation with no distortion occurring in the modulation circuit is not demodulated in the demodulation circuit. If the FM signal to be demodulated is a video signal, the truncation noise appears, as a noise, on a picture to be reproduced by the demodulated signal, which degrades the quality of the reproduced picture. Thus, in the case when the lock range of the PLLFM demodulation circuit is optimized for the more narrow bandwidth of the IFBPF, the lock range is too narrow for the bandwidth of the input signal (the bandwidth of the IFBPFs) when the bandwidth of the IFBPFs is selected to the larger bandwidth and the occurrence of the truncation noise results.

As has been described, in the conventional FM tuner having the IFBPFs with a variable bandwidth, it is impossible to optimize the lock range of the PLLFM demodulation circuit for all the bandwidths of the IFBPFs without introducing a high cost.

SUMMARY OF THE INVENTION

It is an object of the present invention to provide a FM tuner capable of accurately demodulating each of a plurality of FM signals with different Carson bands.

It is another object of the present invention to provide an FM tuner capable of reducing noise included in demodulated signals.

It is a further object of the present invention to provide a FM tuner including an IFBPF having a variable bandwidth and a PLLFM demodulation circuit, being able to set an optimum lock range of the PLLFM demodulation circuit for each of the bandwidths of the IFBPF.

It is a still further object of the present invention to provide a FM tuner, without introducing a high cost, which includes an IFBPF having a variable bandwidth and a PLLFM demodulation circuit and is able to set an optimum lock range of the PLLFM demodulation circuit for all the bandwidths of the IFBPF.

In order to accomplish the above described objects, a FM tuner including a PLLFM demodulation circuit according to the present invention, comprises band converting means for converting the band of a FM signal from a high frequency band to an intermediate frequency band, band component extracting means for extracting a portion of band components from the FM signal converted by the band converting means, demodulation means including a phase locked loop for FM demodulating a FM signal by employing this phase locked loop, and means responsive to a bandwidth of a signal extracted by the band component extracting means for optimizing a lock range of the phase locked loop of the demodulating means. As a result a FM signal is received for providing a FM detected output.

Therefore, in the FM tuner including the PLLFM demodulation circuit according to the present invention, a lock range width of the phase locked loop of the modulating means is not fixed as in the conventional circuit, but the lock range is selected to an optimum value corresponding to the bandwidth of the signal extracted by the band component extracting means According to a preferred embodiment, the band component extracting means comprises a plurality of bandpass filters for extracting signals of different bandwidths, and selecting means for selecting one of the plurality of bandpass filters. The optimizing means comprises input signal level switching means for switching the level of an input signal to be applied to the demodulating means in accordance with an extracting bandwidth of the band component extracting means determined by the bandpass filter selected by the selecting means. In general, the lock range of the phase locked loop of the demodulating means changes depending on the level of the input signal to be applied to the demodulating means. Therefore, according to a first preferred embodiment in which the level of the input signal to be applied to the demodulating means is switched depending on which one of the plurality of bandpass filters is selected, it is possible to select the lock range of the phase locked loop of the demodulating means in accordance with the extracting bandwidth of the selected bandpass filter.

According to another preferred embodiment, the input signal level switching means comprises a first path for transmitting therethrough a FM signal with a bandwidth extracted by the band component extracting means directly to the demodulating means, a second path for transmitting therethrough to the demodulating means the FM signal with the bandwidth extracted by the band component extracting means, which is attenuated or amplified by an attenuator or an amplifier, and means responsive to a selecting signal from the selecting means for enabling either the first path or the second path. The attenuator and amplifier are both implemented in simple circuit configurations which are conventionally known. Therefore, according to the above preferred embodiment employing the attenuator or the amplifier, it is possible to select the lock range of the phase locked loop of the demodulating means in accordance with the extracting bandwidth of the selected bandpass filter merely by addition of the input signal level switching means of a simple circuit configuration to the conventional FM tuner including the PLLFM demodulation circuit.

According to a still further preferred embodiment, the demodulating means comprises a phase comparator, a voltage controlled oscillator, and a loop filter provided between an output of the phase comparator and an input of the voltage controlled oscillator, and the optimizing means comprises gain control means for controlling a gain of the loop filter in accordance with the extracting bandwidth of the band component extracting means. In general, the lock range of the phase locked loop of the demodulating means varies with a loop gain thereof, which generally also depends on the gain of the loop filter for outputting a control voltage of the voltage controlled oscillator. Therefore, even according to the above preferred embodiment in which the gain of the loop filter is changed in accordance with the extracting bandwidth of the band component extracting means, it is possible to select the lock range of the phase locked loop of the demodulating means in accordance with the extracting bandwidth of the band component extracting means.

In one aspect, the FM tuner including the PLLFM demodulation circuit according to the present invention comprises amplifying/converting means for amplifying a FM signal to convert the amplified signal from a high frequency band into an intermediate frequency band, first extracting means for extracting a first band component from the FM signal converted into the intermediate frequency band by the amplifying/converting means, second extracting means for extracting a second band component with a bandwidth more narrow than the bandwidth of the first band component from the FM signal converted into the intermediate frequency band by the amplifying/converting means, selecting means for selecting the first or second extracting means, demodulating means including a phase locked loop having a lock range optimized for an extracting bandwidth of the first extracting means for demodulating a FM signal by employing the phase locked loop, and means for applying the first band component extracted by the first extracting means to the demodulating means when the first extracting means is selected by the selecting means and for attenuating the second band component extracted by the second extracting means so that the lock range of the phase locked loop is optimized for the extracting bandwidth of the second extracting means and for applying the attenuated band component to the demodulating means. As a result, a FM detected output is provided by receiving a FM signal FM signal. According to this tuner, the lock range of the phase locked loop of the demodulating means is optimized for the extracting bandwidth of the extracting means, either when the second extracting means with the more narrow extracting bandwidth is selected by the selecting means or when the first extracting means with the larger extracting bandwidth is selected.

According to the present invention, since the lock range of the PLLFM modulation circuit is always set to an optimum value for all the bandwidths of the IFBPF, the problems which have arisen in the conventional tuner including the PLLFM demodulation circuit for switching only the IFBPF are reduced, namely, noise caused by signals of the bands not to be demodulated, influence of interfering radiowaves and truncation noise.

BRIEF DESCRIPTION OF THE DRAWINGS

The present invention will be come more fully understood from the detailed description given herein below and the accompanying drawings which are given by way of illustration only, and thus, are not limitative of the present invention, and wherein.

DESCRIPTION OF THE PREFERRED EMBODIMENTS

Embodiments of the present invention will be described in detail with reference to the figures.

Figure 3:
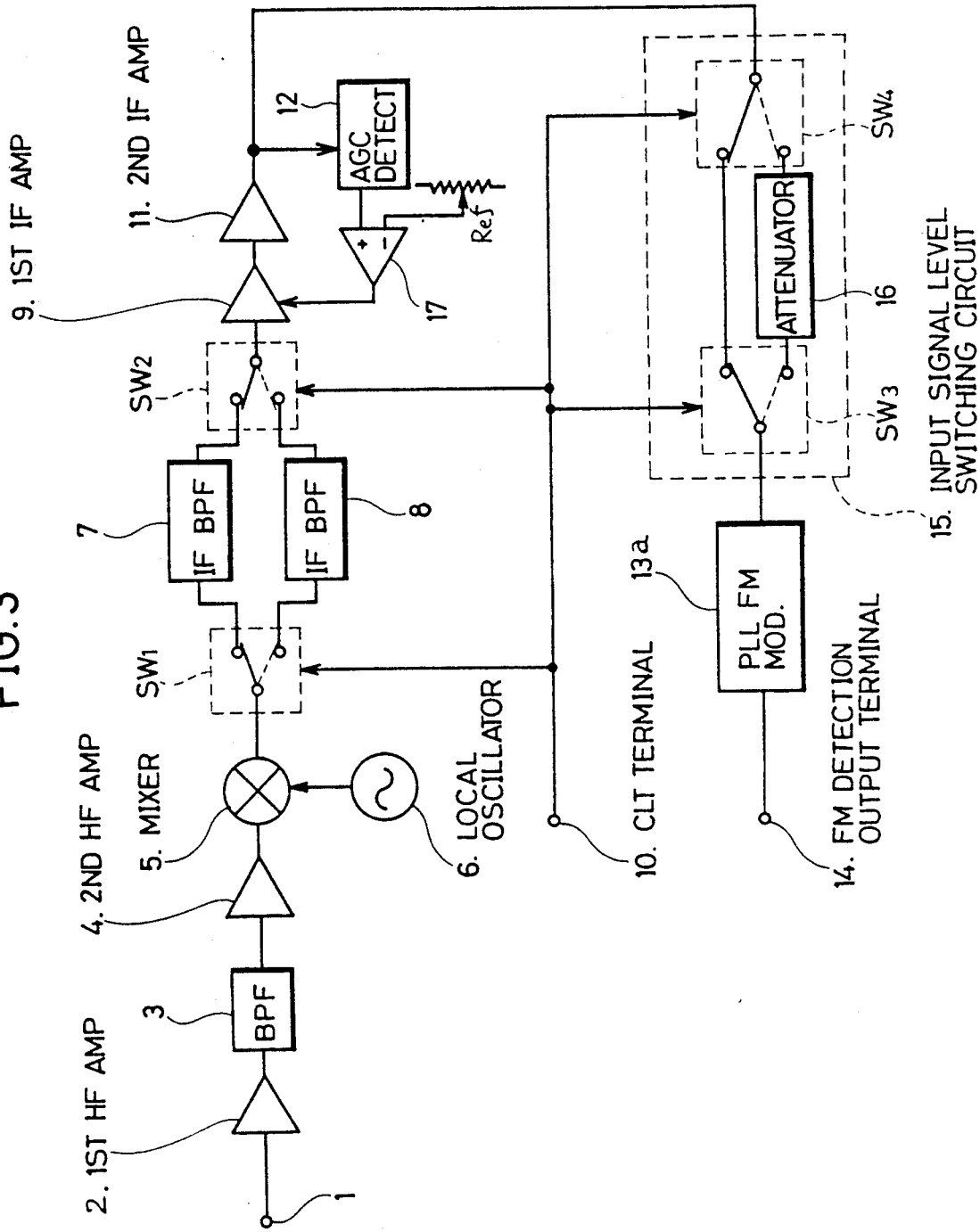
FIG. 3 is a schematic block diagram of a FM tuner according to one embodiment of the present invention.

FIG. 3 is a schematic block diagram of an FM tuner according to an embodiment of the present invention.

Referring to this figure, the FM tuner includes high frequency amplifying circuit portion which is similar to a conventional circuit which includes an input terminal 1 for receiving a high frequency FM signal of a satellite broadcast or the like received through an antenna (not shown), a first high frequency amplifier 2, a BPF 3, a second high frequency amplifier 4, a mixer 5, and a local oscillator 6, which are connected to the input terminal 1.

The FM tuner further includes first and second IFBPFs 7 and 8 for extracting a predetermined band component from an output of the mixer 5, first and second IF amplifiers 9 and 11 for amplifying outputs of the IFBPFs 7 and 8, a PLLFM demodulation circuit 13a for demodulating a FM signal to be outputted from the IF amplifier 11, and a FM detection output terminal 14 supplied with a signal demodulated by the PLLFM demodulation circuit 13a (a FM detected output). A demodulated signal provided to the FM detection output terminal 14 is applied to a video terminal and an audio terminal of a home TV or the like (not shown) via a signal processing circuit portion (not shown) such as a deemphasis circuit.

The first and second IFBPFs 7 and 8 are provided between an output of the mixer 5 and an input of the first IF amplifier 9 through switches $SW_1$ and $SW_2$.

The switches $SW_1$ and $SW_2$ are controlled by a control signal to be applied to a control terminal 10 which will be described later, and selectively connect the IFBPF 7 or 8 between the mixer 5 and the first IF amplifier 9.

The IFBPF 8 extracts a signal with a frequency range more narrow than the frequency range extracted by the IFBPF 7, with a frequency approximately equal to a center frequency of a band component extracted by the IFBPF 7 employed as a center frequency. That is, an extracting bandwidth wb of the IFBPF 8 is more narrow than the bandwidth IFBPF 7, wa. Therefore, the bandwidths of the IFBPFs are selectable in accordance with the operation of the switches $SW_1$ and $SW_2$.

The tuner further includes an AGC (Automatic Gain Control) detection circuit 12 and a comparator 17, which are usually provided to make constant the level of a FM signal to be inputted to the modulation circuit. The level of a portion of a signal amplified by the second IF amplifier 11 is detected by the AGC detection circuit 12 and compared with a predetermined reference voltage Ref in the comparator 17. If the level of a detection output level of the AGC detection circuit 12 is lower than the reference voltage Ref, the comparator 17 increases a gain of the first IF amplifier 9. Conversely, if the level of the detection output of the AGC detection circuit 12 is higher than the reference voltage Ref, the comparator 17 decreases the gain of the first IF amplifier 9. As a result, the level of the FM signal amplified by the first and second IF amplifiers is kept constant. That is, the level of the FM signal to be demodulated by the PLLFM demodulation circuit 13a is determined by the reference voltage Ref of the comparator 17.

Switching of the switches $SW_1$ and $SW_2$ is carried out via an external switch not shown. In more detail, the control terminal 10 is connected to the external switch via a control portion (not shown) of a microcomputer or the like, so that when a user selects the external switch, in response to this selection, a control signal for determining a connection state in the switches $SW_1$ and $SW_2$ is inputted from the control portion to the control terminal 10.

The foregoing configuration is the same as the configuration of the conventional FM tuner including the PLLFM demodulation circuit. However, unlike the conventional FM tuner, the present FM tuner includes an input signal level switching circuit 15 as a major portion of the embodiments of the present invention, which is provided between the second IF amplifier 11 and the PLLFM demodulation circuit 13a. The input signal level switching circuit 15, which serves to change the level of an input signal to be applied to the PLLFM demodulation circuit 13a, includes an attenuator 16 and switches $SW_3$ and $SW_4$ for performing a switching operation grouped with the above switches $SW_1$ and $SW_2$ in response to the control signal from the control terminal 10. The switches $SW_3$ and $SW_4$ connect an output of the second IF amplifier 11 directly to or via the attenuator 16 to the PLLF demodulation circuit 13a.

The level of the FM signal to be demodulated by the PLLFM demodulation circuit 13a, which is determined by the reference voltage Ref in the comparator 17, is set in accordance with a lock range of the PLLFM demodulation circuit 13a. This is due to the fact that the lock range of the PLLFM demodulation circuit varies depending on the level of an input signal.

Figure 4:
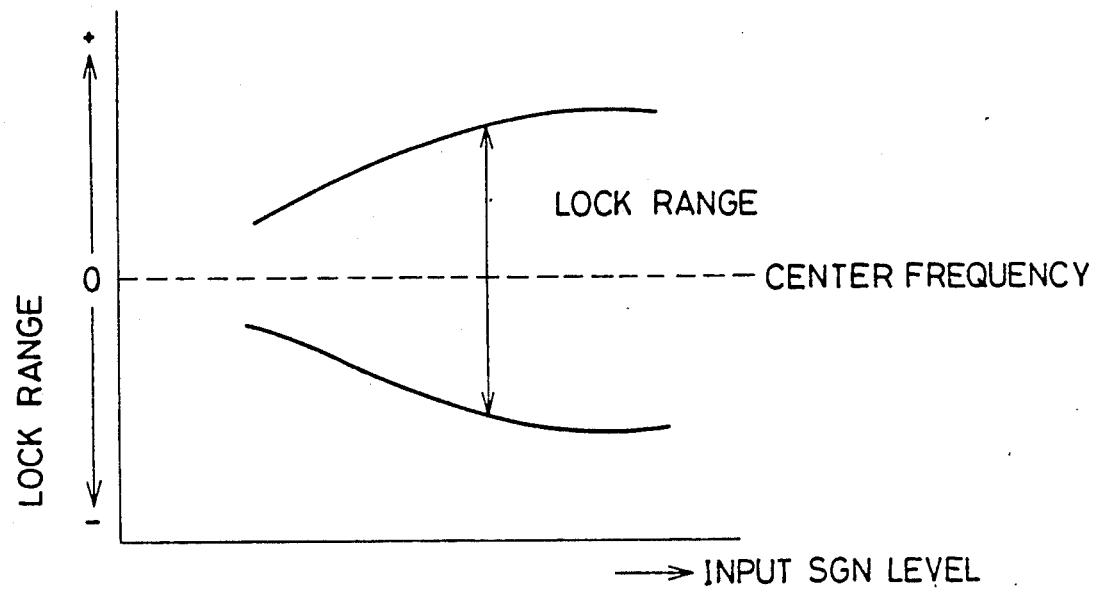
FIG. 4 is a graph illustrating a relationship between an input signal level and a lock range of a PLLFM demodulation circuit.

FIG. 4 is a graph illustrating a relationship between the input signal level and the lock range of the PLLFM demodulation circuit.

As illustrated in this figure, the lock range of the PLLFM demodulation circuit changes depending on the input signal level thereof accordingly, the higher the input signal level is, the larger the lock range is with respect to a center frequency, while the lower the input signal level is, the smaller the lock range is with respect to the center frequency.

Figure 5:
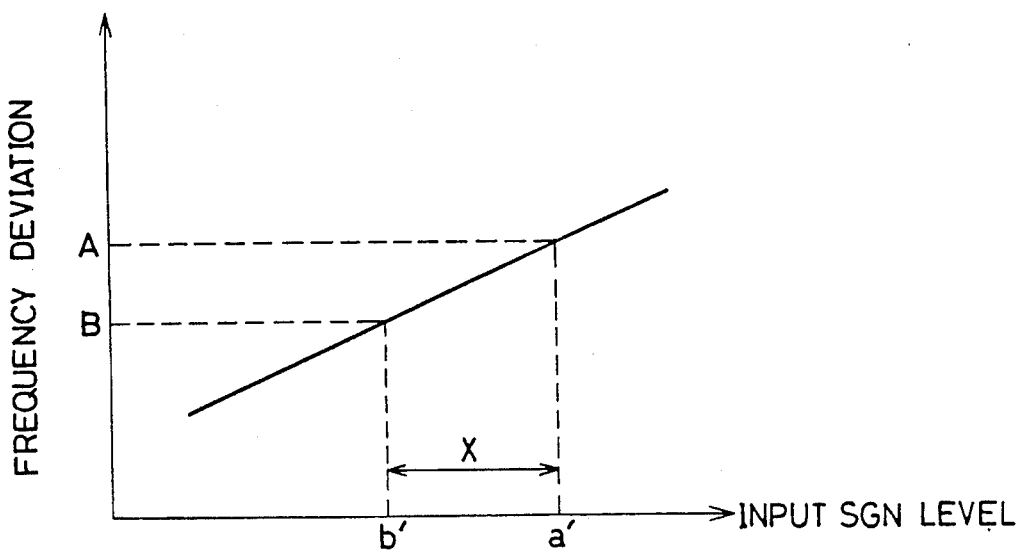
FIG. 5 is a graph illustrating a relationship between the input signal level and a lock range width of the PLLFM demodulation circuit.

FIG. 5 is a graph illustrating a relationship between the input signal level and a lock range width of the PLLFM demodulation circuit 13a. As can be seen from FIG. 5, the lock range width increases in proportion to an increase in the input signal level. Symbols A and B in FIG. 5 represent optimum lock ranges of the PLLFM demodulation circuit 13a for the respective bandwidths of the IFBPFs 7 and 8 in FIG. 3, while symbols a' and b' represent the input signal levels of the PLLFM demodulation circuit 13a corresponding to the respective optimum lock ranges A and B thereof for the respective bandwidths of the IFBPFs 7 and 8.

In the present embodiment, an output signal level of the second IF amplifier 11 is set to an input signal level of the PLLFM demodulation circuit 13a, which corresponds to an optimum lock range width of the modulation circuit 13a for a band extracted by the IFBPF 7 with the larger bandwidth. Meanwhile, attenuation of the attenuator 16 is set to such a value that the output signal level of the second IF amplifier 11 is attenuated to the input signal level of the PLLFM demodulation circuit 13a, corresponding to the optimum lock range width thereof for a band extracted by the IFBPF 8 with the more narrow bandwidth. That is to say, in the present embodiment, the output signal level of the second IF amplifier 11 is set to the level a' in FIG. 5, and the attenuator 16 is set to attenuate an applied signal by a difference X between the input signal levels a' and b' in FIG. 5.

Since the FM tuner of the present embodiment has a configuration such as above, the FM signal which is received through the antenna and provided to the input terminal 1 is amplified, similarly to the conventional FM tuner, by the first high frequency amplifier 2, the BPF 3 and the second high frequency amplifier 4, and then converted in frequency by the mixer 5 and the local oscillator 6 to have a portion of band components thereof extracted by the IFBPF 7 or 8. Furthermore, the FM signal of the band extracted by the IFBPF 7 or 8 is amplified to a fixed level by the first and second IF amplifiers 9 and 11, and then, unlike the conventional FM tuner, inputted to the PLLFM demodulation circuit 13a via the input signal level switching circuit 15. The PLLFM demodulation circuit 13a demodulates only a band component within the lock range at this point out of the applied FM signal, and provides the demodulated component to the FM detection output terminal 14.

A detailed description will follow for the internal connection state of the switches $SW_1$-$SW_4$ and on the operation of the present FM tuner.

First of all, the control signal applied to the control terminal 10 causes the internal connection state of the switches $SW_1$ and $SW_2$ to be set so that the IFBPF 7 with the larger bandwidth is connected between the mixer 5 and the first IF amplifier 9. Grouped with this setting, the internal connection state of the switches $SW_3$ and $SW_4$ is set so as to connect an output of the second intermediate frequency amplifier 11 directly to an input terminal of the PLLFM demodulation circuit 13a (in the case where the internal connection state of the switches $SW_1$-$SW_4$ is denoted by the solid line in the figure).

The lock range of the PLLFM demodulation circuit 13a is now already optimized for a bandwidth a of the IFBPF 7. Therefore, since the lock range of the PLLFM demodulation circuit 13a is optimized for a bandwidth of the FM signal to actually be inputted to the PLLFM demodulation circuit 13a, in this case, demodulation is performed under preferable conditions.

On the other hand, the control signal applied to the control terminal 10 causes the internal connection state of the switches $SW_1$ and $SW_2$ to be set so that the IFBPF 8 with more narrow bandwidth is connected between the mixer 5 and the first IF amplifier 9. Grouped there with, the internal connection state of the switches $SW_3$ and $SW_4$ is set so that the attenuator 16 is connected between the second IF amplifier 11 and the PLLFM demodulation circuit 13a (in the case where the internal connection state of the switches $SW_1$-$SW_4$ is denoted with the broken line in the figure). At this time, the bandwidth wa of the IFBPF 7 is selected as a bandwidth of a signal to be applied to the PLLFM demodulation circuit 13a by the switches $SW_1$ and $SW_2$. Since the bandwidth wa of the IFBPF 7 is here set to be larger than the bandwidth wb of the IFBPF 8, the lock range width of the PLLFM demodulation circuit 13a at this time must be set to the value (indicated by the designation B in FIG. 5) smaller than the value (indicated by the designation A in FIG. 5) when the bandwidth wa of the IFBPF 7 is selected. That is, in the case when the filter to determine the bandwidth of the input signal of the modulation circuit 13a is switched from the IFBPF 7 to the IFBPF 8, the level of the signal to actually be inputted to the modulation circuit 13a should be changed from the value a' to b' in FIG. 5, depending on the change in the optimum lock range of the modulation circuit 13a.

Meanwhile, the switches $SW_3$ and $SW_4$ at this time cause the output signal of the second IF amplifier 11 to be inputted via the attenuator 16 to the PLLFM demodulation circuit 13a. The attenuator 16 is here set to attenuate, by the difference X in FIG. 5, the signal to be inputted to the PLLFM demodulation circuit 13a, i.e., the level of the output signal of the second IF amplifier 11. Therefore, in the case when the bandwidth of the signal to be inputted to the modulation circuit 13a is switched to the bandwidth of the IFBPF 8, the level of the signal to be inputted to the modulation circuit 13a from the attenuator 16 is attenuated from the value a' to b' illustrated in FIG. 5. Thus, the lock range of the PLLFM demodulation circuit 13a is also optimized for the bandwidth of the FM signal to actually be inputted to the modulation circuit 13a, so that demodulation is carried out under the preferable conditions.

Figure 6:
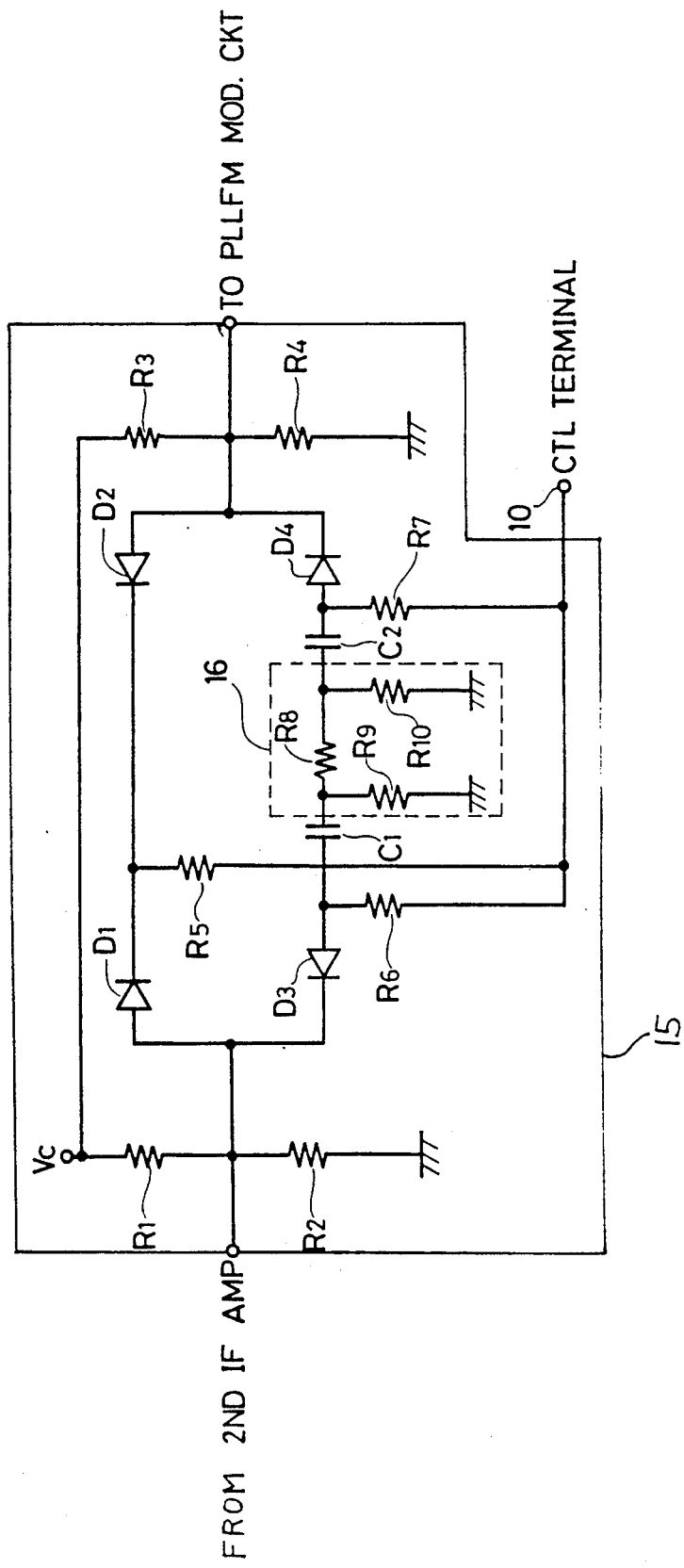
FIG. 6 is a circuit diagram illustrating a detailed example of an input signal level switching circuit in FIG. 3.

FIG. 6 is a circuit diagram illustrating one example of the detailed configuration of the input signal level switching circuit 15 for performing the above described functions.

Referring to FIG. 6, the control signal applied to the control terminal 10 is applied to the cathodes of diodes D1 and D2 via a resistor R5, to a diode D3 via a resistor R6, and to the anode of a diode D4 via a resistor R7. When the control signal is at the low level, the diodes D1 and D2 are rendered conductive, while the diodes D3 and D4 are rendered non-conductive. Therefore, an output of the second IF amplifier 11 inputted to the connecting point of the resistors R1 and R2 provided between a voltage supply $V_c$ and the ground is inputted as it is, from the connecting point of the resistors R3 and R4 to the PLLFM demodulation circuit 13a via the diodes D1 and D2 in this case.

Conversely, when the control signal is at the high level, the diodes D1 and D2 are rendered non-conductive, while the diodes D3 and D4 are rendered conductive. Therefore, in this case, the output of the second IF amplifier 11 is inputted to the connecting point of resistors R8 and R9 constituting the attenuator 16 via the diode D3 and a capacitor C1, and is taken out from the connecting point of the resistors R8 and R10 constituting the attenuator 16. That is, the output of the second IF amplifier 11 is divided in voltage by the resistors R8 and R10 to be attenuated. An output of the attenuator 16 is inputted to the PLLFM demodulation circuit 13a via a capacitor C2 and the diode D4.

According to the input signal level switching circuit with the above described configuration, the level of the input signal of the PLLFM demodulation circuit 13a is switched to two values depending on the level of the control signal applied to the control terminal 10. Therefore, in the case of employing the input signal level switching circuit with the above configuration as the input signal level switching circuit 15 in FIG. 3, the switches $SW_1$ and $SW_2$ in FIG. 3 are also configured to operate by receiving direct current potentials of the low level (e.g., the ground potential) and of the high level (e.g., the potential of the voltage supply $V_c$), as a control signal.

In general, the switches $SW_1$ and $SW_2$ also employ elements such as a relay and a diode which are controlled by a direct current voltage.

According to the embodiment as described above, even if the optimal lock range width of the PLLFM demodulation circuit is designed for the bandwidth of the input signal when the larger bandwidth of the IFBPF is selected, the lock range width of the modulation circuit becomes smaller due to performance of the attenuator when more narrow bandwidth of the IFBPF is selected. Thus, the lock range width is automatically switched to an optimum value for the bandwidth of the input signal to be applied to the modulation circuit at this time.

Although the above described embodiment is concerned with the case of switching the bandwidth of the IFBPF to two stages, the described embodiments are also applicable to the case of switching the bandwidth to three or more stages. That is, in such cases the input signal level switching circuit may include a plurality of attenuators (corresponding to the number of the bandwidths of the IFBPFs in detail) with different attenuations, for example, and selectively switching any of these attenuators in accordance with the bandwidth of the selected IFBPF to connect a selected one of the attenuators between an input terminal of the PLLFM demodulation circuit and an output terminal of the second IF amplifier. As a matter of course, the respective attenuations of these attenuators should be set so as to optimize the lock range of the PLLFM demodulation circuit for the respective bandwidths of the IFBPFs to be selected for changing the level of the signal to be inputted to the modulation circuit. Moreover, the plurality of attenuators may be replaced with a single attenuator with variable attenuation.

If employing the fact that the lock range of the PLLFM demodulation circuit changes depending on the input signal level as described above, the lock range width of the PLLFM demodulation circuit can always be kept at the optimum value for the bandwidth of the input signal to be inputted to the modulation circuit in spite of the switching in the bandwidths of the IFBPFs, by changing the input signal level of the modulation circuit so that the lock rang of the modulation circuit is optimized for the bandwidth of the selected IFBPF.

In the embodiment illustrates in FIG. 3, the output level of the second IF amplifier is set so that the lock range of the PLLFM demodulation circuit is optimized for the output of the IFBPF with the larger bandwidth. However, the output level may also be set so that the lock range is optimized for the output of the other IFBPF with the more narrow bandwidth. In this case, the reference voltage Ref of the comparator 17 may be set so that the output level of the second IF amplifier 11 in FIG. 3 becomes equal to the level b' in FIG. 5, and the attenuator may be replaced by an amplifier for amplifying the input signal level by the difference X in FIG. 5 in order to change the level of the input signal to be applied to the PLLFM demodulation circuit 13a. That is, when the IFBPF with the more narrow bandwidth is selected, the input signal level switching circuit transmits an output of the second IF amplifier to the PLL demodulation circuit as it is. Conversely, when the IFBPF with the larger bandwidth is selected, the output of the second IF amplifier is amplified by the difference X with an amplifier in the input signal level switching circuit and then transmitted to the demodulation circuit.

Figure 1:
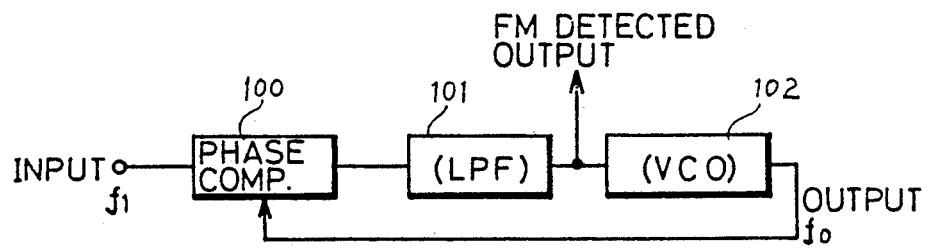
FIG. 1 is a block diagram illustrating a configuration of a PLL.
Figure 2:
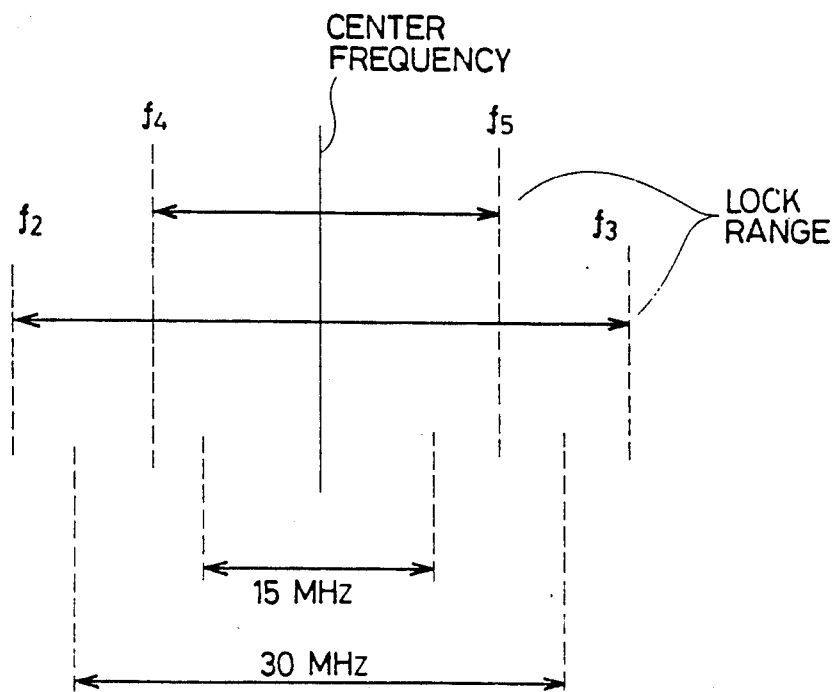
FIG. 2 is a diagram illustrating disadvantages in a conventional FM tuner including a PLLFM demodulation circuit.

All the described embodiments utilize the fact that the lock range width of the PLLFM demodulation circuit changes depending on the input signal level thereof. In general, the lock range width of the PLLFM demodulation circuit increases as the loop gain of the PLL constituting the demodulation circuit increases. The loop gain of the PLL also depends on the gain of the low pass filter (see FIG. 1) included therein. Therefore, it is possible to change the lock range of the PLLFM demodulation circuit by changing the gain of the low pass filter.

Figure 7:
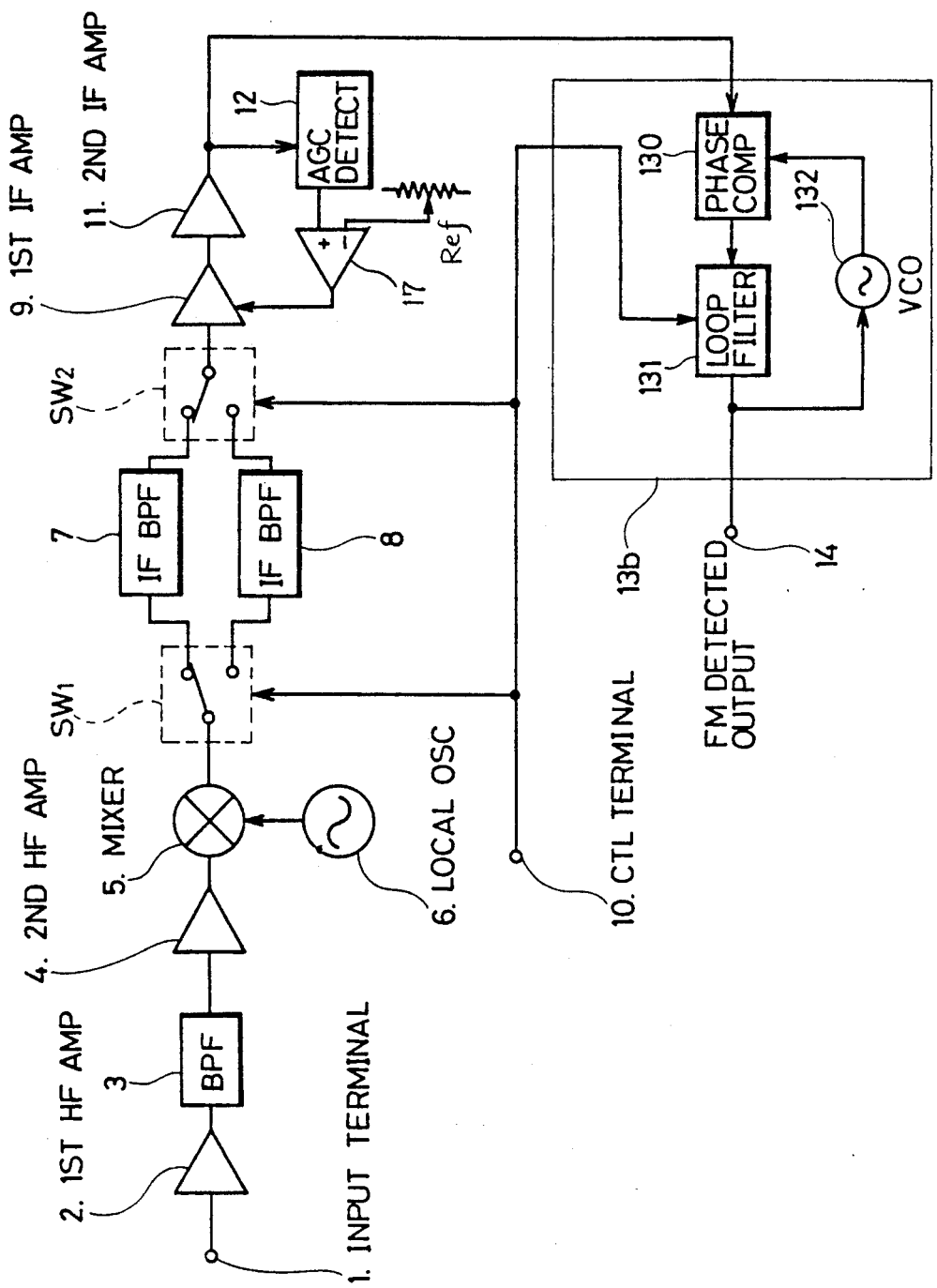
FIG. 7 is a schematic block diagram of a FM tuner according to another embodiment of the present invention.

FIG. 7 which illustrates another embodiment of the present invention, is a schematic block diagram of a FM tuner employing the above described method of changing the lock range width of the PLLFM demodulation circuit.

Referring to FIG. 7, the FM tuner according to the present embodiment, in contrast to the FM tuner illustrated in FIG. 3, does not include the input signal level switching circuit 15 in FIG. 3 but a PLLFM demodulation circuit 13b which is directly controlled by the control signal from the control terminal 10.

The PLLFM demodulation circuit 13b, in contrast to the circuit illustrated in FIG. 3, includes a phase comparator 130, a VCO 132, and a loop filter 131 gain-controlled by the control signal to be applied to the control terminal 10. The loop filter 131 corresponds to the LPF 101 in FIG. 1. The loop filter 131 decreases the gain due to a control signal employed in the case when the switches $SW_1$ and $SW_2$ select the IFBPF 8 with the more narrow bandwidth, while the loop filter 31 increases the gain due to a control signal employed in the case when the switches $SW_1$ and $SW_2$ select the IFBPF 7 with the larger bandwidth. The remaining portions of the present FM tuner and similar to the FM tuner illustrated in FIG. 3.

Figure 8:
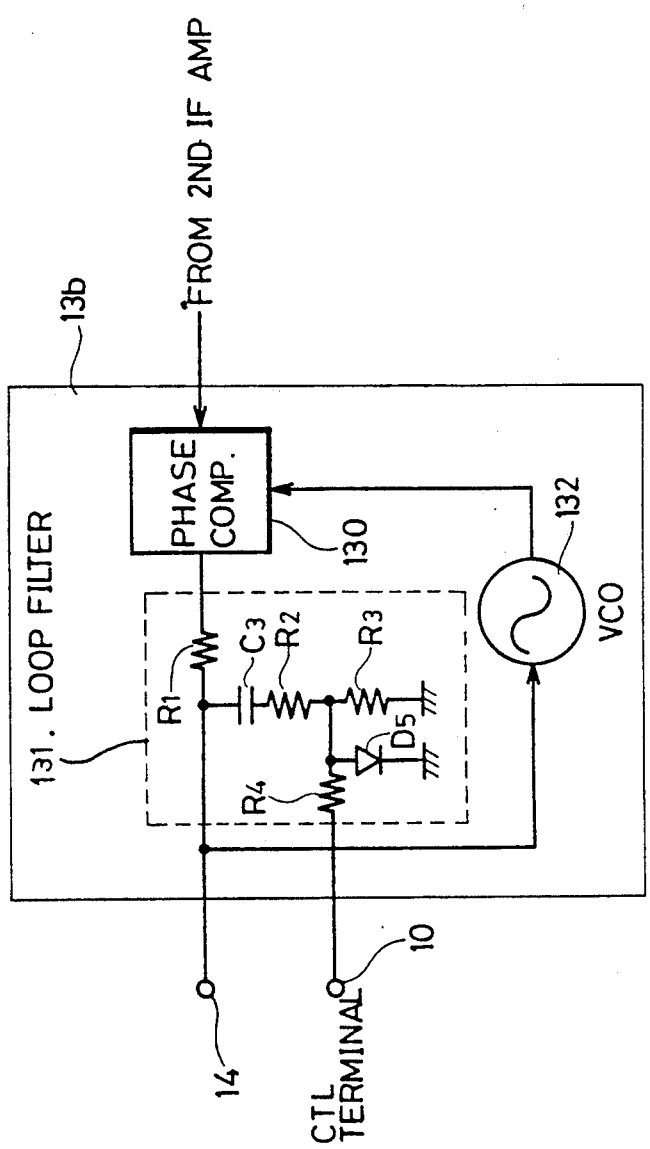
FIG. 8 is a circuit diagram illustrating a detailed example of the loop filter in FIG. 7.

FIG. 8 is a circuit diagram illustrating a detailed example of the configuration of the loop filter 131.

Referring to FIG. 8, the loop filter 131 in the PLLFM demodulation circuit 13b includes a resistor R1 provided between an output terminal of the phase comparator 130 and an input terminal of the VCO 132, and a series connection of a capacitor C3, and resistors R2 and R3, which are provided between the input terminal of the VCO 132 and the ground. The loop filter 131 further includes a resistor R4 and a diode D5 provided between a connecting point of the resistors R2 and R3 and the control terminal 10, and between the connecting point and the ground, respectively.

A control signal from the control terminal 10 is applied via the resistor R4 to the diode D5. An output of the phase comparator 130 is filtered by an integrating circuit formed of the resistor R1 and the capacitor C3. When the control signal attains a high level, the diode D5 becomes conductive and then the resistor R2 is grounded via the diode D5. Thus, a discharge from the capacitor C3 is carried out via the resistor R2 in this case. On the other hand, when the control signal attains a low level, the diode D5 becomes non-conductive, and thus the discharge from the capacitor C3 is carried out via the resistors R2 and R3. Accordingly, the gain of the loop filter 131 in the case where the high level of the control signal is lower than the gain of the loop filter 131 in the case for the low level thereof Namely, the lock range width of the PLLFM demodulation circuit 13b in the case where the high level of the control signal is more narrow than the loop range width in the case for the low level thereof.

Thus, according to the present embodiment, in order to adapt the lock range of the PLLFM demodulation circuit 13b to the bandwidth of the selected IFBPF, the switching level of the switches $SW_1$ and $SW_2$ is set so that a conduction state of the diode D5 is switched in accordance with the switching in the internal connection state of the switches $SW_1$ and $SW_2$ in FIG. 7. That is, the switches $SW_1$ and $SW_2$ receive the control signal of the low level to select the IFBPF 7 with the larger bandwidth, while the switches receive control signal of the high level to select the IFBPF 8 with the more narrow bandwidth. Resistance values of the resistors R2 and R3 are set so that the lock range width of the PLLFM demodulation circuit 13b is switched to the value A or B in FIG. 5 in accordance with a change in the gain due to ON/OFF of the diode D5.

As aforementioned, the same effect as in the case of the previous embodiments can be accomplished also by controlling the PLLFM demodulation circuit itself in accordance with the change in the bandwidths of the IFBPFs.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A FM tuner for receiving a FM signal and developing a FM detected output in response to a select signal for controlling the filter characteristics of the FM tuner, comprising:
    band converting means for converting the band of said FM signal from a high frequency band into an intermediate frequency band;
    band component extracting means for extracting a portion of a band component from the FM signal converted in band by said band converting means in response to said select signal;
    demodulating means having a phase locked loop for FM demodulating said FM signal by employing said phase locked loop in response to said select signal; and
    optimizing means responsive to a bandwidth of the signal extracted by said band component extracting means for optimizing a lock range of the phase locked loop of said demodulating means in response to said select signal.

2. A FM tuner according to claim 1, wherein said band component extracting means comprises
    a plurality of bandpass filters for extracting signals having a plurality of bandwidths and
    selecting means for selecting one bandpass filter out of said plurality of bandpass filters in response to said select signal.

3. A FM tuner according to claim 2, wherein
    said optimizing means comprises input signal level switching means for switching the level of an input signal to be transmitted to said demodulating means in response to an extraction bandwidth of said band component extracting means determined by said one bandpass filter selected by said selecting means.

4. A FM tuner according to claim 3, wherein said input signal level switching means comprises
    a first path for transmitting therethrough said FM signal having a band width extracted by said band component extracting means directly to said demodulating means;
    a second path for attenuating or amplifying said FM signal having a bandwidth extracted by said band component extracting means and transmitting the attenuated or amplified FM signal to said demodulating means and
    enabling means responsive to said select signal from said selecting means for enabling said first path or said second path.

5. A FM tuner according to claim 4, wherein said second path comprises an attenuator.

6. A FM tuner according to claim 4, wherein said second path comprises an amplifier.

7. A FM tuner according to claim 2, wherein
    said demodulating means comprises a phase comparator, a voltage controlled oscillator, and a loop filter connected between an output of said phase comparator an input of said voltage controlled oscillator.

8. A FM tuner according to claim 7, wherein
    said optimizing means comprises gain control means for switching a gain of said loop filter in response to the extraction bandwidth of said band component extracting means.

9. A FM tuner for receiving a FM signal and developing a FM detected output, comprising:
    amplifying/converting means for amplifying said FM signal and converting the band of the amplified signal from a high frequency band into an intermediate frequency band;
    first extracting means for extracting a first band component from the FM signal converted into the intermediate frequency band by said amplifying/converting means;
    second extracting means for extracting a second band component having a more narrow bandwidth than the bandwidth of said first band component from the FM signal converted into the intermediate frequency band by said amplifying/converting means;
    demodulating means comprising a phase locked loop having a lock range optimized for a first extraction bandwidth of said first extracting means for demodulating said FM signal by employing said phase locked loop; and
    means for applying said first band component extracted by said first extracting means to said demodulating means, while said first extracting means is being selected by said selecting means, and for attenuating the second band component extracted by said second extracting means so that the lock range of said phase locked loop is optimized for a second extraction bandwidth of said second extracting means, and applying the attenuated second band component to said demodulating means, while said second extracting means is being selected by said selecting means.

10. A FM tuner for receiving a FM signal and developing a FM detected output in response to a select signal for controlling the filter characteristics of the FM tuner, comprising:
    band converting means for converting the band of said FM signal from a high frequency band into an intermediate frequency band;
    band component extracting means for extracting a portion of a band component from the FM signal converted in band by said band converting means in response to said select signal, said band component extracting means including,
        a plurality of bandpass filters for extracting signals having a plurality of bandwidths, and
        selecting means for selecting one bandpass filter out of said plurality of bandpass filters in response to said select signal;
    demodulating means having a phase locked loop for FM demodulating said FM signal by employing said phase locked loop in response to said select signal said demodulating means including a phase comparator, a voltage controlled oscillator, and a loop filter connected between an output of said phase comparator and an input of said voltage controlled oscillator; and
    optimizing means responsive to a bandwidth of the signal extracted by said band component extracting means for optimizing a lock range of said phase locked loop of said demodulating means in response to said select signal, said optimizing means including gain control means for switching a gain of said loop filter in response to the extraction bandwidth of said band component extracting means.

11. A FM tuner for receiving a FM signal and developing a FM detected output in response to a select signal for controlling the filter characteristics of the FM tuner, comprising:
 band converting means for converting the band of said FM signal from a high frequency band into an intermediate frequency band;
 band component extracting means for extracting a portion of a band component from the FM signal converted in band by said band converting means in response to said select signal, said band component extracting means including,
  a plurality of bandpass filters for extracting signals having a plurality of bandwidths, and
  selecting means for selecting one bandpass out of said plurality of bandpass filters in response to said select signal;
 demodulating means having a phase locked loop for FM demodulating said FM signal by employing said phase locked loop in response to said select signal, and
 optimizing means responsive to a bandwidth of the signal extracted by said band component extracting means for optimizing a lock range of said phase locked loop of said demodulating means in response to said select signal, said optimizing means including input signal level switching means for switching the level of an input signal to be transmitted to said demodulating means in response to an extraction bandwidth of said band component extracting means determined by said one bandpass filter selected by said selecting means.

12. A FM tuner according to claims 11, wherein said input signal level switching means comprises
 a first path for transmitting therethrough said FM signal having a bandwidth extracted by said band component extracting means directly to said demodulating means;
 a second path for attenuating or amplifying said FM signal having a bandwidth extracted by said band component extracting means and transmitting the attenuated or amplified FM signal to said demodulating means; and
 enabling means responsive to said select signal from said selecting means for enabling said first path or said second path.

13. A FM tuner according to claim 12, wherein said second path comprises an attenuator.

14. A FM tuner according to claim 12, wherein, said second path comprises an amplifier.

15. A method of receiving a FM signal and developing a FM detected output in response to a select signal for controlling the filter characteristics of a FM tuner, comprising the steps of:
 (a) converting the band of said FM signal from a high frequency band into an intermediate frequency band;
 (b) extracting a portion of a band component from the FM signal converted in band at said step (a) in response to said select signal;
 (c) FM demodulating said FM signal by employing a phase locked loop in response to said select signal; and
 (d) optimizing a lock range of said phase locked loop in response to said select signal in response to a bandwidth of the signal extracted at said step (b).

* * * * *